United States Patent [19]

Segawa et al.

[11] Patent Number: 5,506,401

[45] Date of Patent: Apr. 9, 1996

[54] PHOTOELECTRIC CONVERTING DEVICE MOUNTING APPARATUS WITH ANISOTROPICALLY CONDUCTIVE FILM FOR CONNECTING LEADS OF WIRING BOARD AND ELECTRODE PADS OF PHOTOELECTRIC CONVERTING DEVICE AND FABRICATION METHOD THEREOF

[75] Inventors: Masao Segawa, Fujisawa; Kazushige Ooi, Yokohama; Masanobu Kimura, Kamakura; Shuichi Sugi, Tokyo, all of Japan

[73] Assignees: Kabushiki Kaisha Toshiba, Kanagawa; Toshiba Ave Co., Ltd., Tokyo, both of Japan

[21] Appl. No.: 277,320

[22] Filed: Jul. 25, 1994

Related U.S. Application Data

[63] Continuation of Ser. No. 249,571, May 26, 1994, abandoned.

[30] Foreign Application Priority Data

May 28, 1993 [JP] Japan .................................. 5-126763

[51] Int. Cl.$^6$ ............................ G03B 19/00; H04N 3/14
[52] U.S. Cl. ................................. 250/208.1; 250/214.1; 348/76
[58] Field of Search ........................... 250/208.1, 214.1, 250/214 R, 239, 551; 358/483, 482; 348/76, 65

[56] References Cited

U.S. PATENT DOCUMENTS

| 4,113,981 | 9/1978 | Fujita et al. | 174/88 R |
| 5,019,201 | 5/1991 | Yabu et al. | 156/273.9 |
| 5,021,888 | 6/1991 | Kondou et al. | 348/76 |
| 5,042,919 | 8/1991 | Yabu et al. | 359/88 |

FOREIGN PATENT DOCUMENTS 62-126665  6/1987  Japan .

| 4-5947 | 1/1992 | Japan . |
| 4-242939 | 8/1992 | Japan . |
| 5-34603 | 2/1993 | Japan . |

OTHER PUBLICATIONS

English language abstract of Japanese Publication No. JP4005947, vol. 16, No. 148, Apr. 13, 1992.
English language abstract of Japanese Publication No. JP1161795, vol. 13, No. 433, Sep. 27, 1989.
English language abstract of Japanese Publication No. JP4242939, vol. 17, No. 013, Jan. 11, 1993.
English language abstract of Japanese Publication No. JP62126665, vol. 11, No. 346, Nov. 12, 1987.
English language abstract of Japanese Publication No. JP5034603, vol. 17, No. 320, Jun. 17, 1993.
English language abstract of Japanese Publication No. JP5013497, vol. 17, No. 276, May 27, 1993.
English language abstract of Japanese Publication No. JP3167835, vol. 15, No. 048, Oct. 17, 1991.
English language abstract of Japanese Publication No. JP2230749, vol. 14, No. 541, Nov. 29, 1990.
European Search Report for European Application No. 94303736.6, dated Sep. 23, 1994.
"A New CCD Module Using The Chip On Glass (COG) Technique", Kondoh et al., ISHM '90 Proceedings, pp. 487–494 (1990).
"Packaging Technology of Ultra Micro Video Camera", Suzuki et al., MES '93 Proceedings, pp. 251–254 (1993).

Primary Examiner—Edward P. Westin
Assistant Examiner—John R. Lee
Attorney, Agent, or Firm—Finnegan, Henderson, Farabow, Garrett & Dunner

[57] ABSTRACT

A plurality of leads are formed on a wiring board which is adhered onto a light transmitting member for transmitting a light beam. A plurality of electrode pads are formed, corresponding to the leads, on a photoelectric converting device. An anisotropically conductive film is formed between each of the leads and each of the corresponding electrode pads.

14 Claims, 15 Drawing Sheets

PHOTOELECTRIC CONVERTING DEVICE MOUNTING APPARATUS WITH ANISOTROPICALLY CONDUCTIVE FILM FOR CONNECTING LEADS OF WIRING BOARD AND ELECTRODE PADS OF PHOTOELECTRIC CONVERTING DEVICE AND FABRICATION METHOD THEREOF

This application is a continuation of application Ser. No. 08/249,271, filed May 26, 1994 now abandoned.

BACKGROUND OF THE INVENTION

1. Field of the Invention

The present invention relates to a photoelectric converting device mounting apparatus for use with a camera or the like that mounts a photoelectric converting device such as a CCD and a fabrication method thereof.

2. Description of the Related Art

Cameras having a CCD have been widely used in various fields from home use to industrial use. Small medical cameras have been used for endoscopes. At present time, the minimum diameter of these cameras is 8 mm. However, since small diameters of cameras are being strongly desired to improve the characteristics of the endoscopes and marketability thereof, these very small cameras are being intensively studied and developed. The central portions of such cameras are CCDs. The packaging techniques for the CCDs are the most important development theme. As the CCD packages for conventional cameras, ceramic packages have been widely used from viewpoints of mass production and low cost. However, since the sizes of the ceramic packages are limited with the ceramic packages, alternate mounting techniques are being developed by many manufacturers.

Next, a related art reference of a conventional mounting method that is practically used will be described.

FIG. 23 shows an example of COG (Chip On Glass) method. In this method, an optical glass 1 is prepared (at step a). A thick gold film wiring layer 4 is formed at a plane portion 2 and an edge portion 3 of the optical glass (at step b). A low melting point metal paste is printed at a connecting portion for the CCD. An example of the metal paste is an alloy of indium and lead. The metal paste is heated and melted so as to form bumps 5 (at step c). A CCD 6 is prepared (at step d). Metal ball bumps 7 are formed on the CCD 6 according to wire bonding method (at step e). The metal bumps 5 on the optical glass 1 and the metal ball bumps 7 on the CCD 6 are heat pressed at a heat resisting temperature of the CCD or less (namely, 150° C. or less) so as to connect the metal bumps 5 and the corresponding gold ball bumps 7 (at step f). In addition, to improve the mechanical strength of the connected portion, the space between the bump connected portions and the CCD pixels is filled and sealed with a resin 8 (at step g). Thereafter, an outer connecting electrode 9 disposed at an edge of the optical glass 1 is connected to a flexible substrate 10 (at step h). At this point, with an adhesive sheet or the like having for example anisotropy characteristics, the outer connecting electrode 9 and the flexible substrate 10 are heat pressed. As an advantage of the COG method, the alignment accuracy between the CCD and the optical glass is as high as 10 μm.

Next, another related art reference will be described with reference to FIG. 24.

FIG. 24 are a schematic diagram showing SP-TAB (Single Point TAB) method. A TAB tape 17 that has metal plated bumps is prepared (at step a). The bumps of the TAB tape 17 are connected to corresponding electrode pads of a CCD 15 by a small bonding heater tool 8 according to ultrasonic heat pressing method (at step b). As with the COG method, the heat pressing is performed at the heat resisting temperature of the CCD or less (namely, 150° C. or less) by the small heater tool 18. As the most advantage of this mounting method, after the CCD was mounted, the characteristics thereof can be inspected on the TAB tape 17. An optical adhesive agent 19 is coated on the upper surface of the CCD 15 (at step c). The optical glass 11 is precisely placed on the upper surface of the CCD 15 (at step d). At this point, the accuracy of the disposition is around ±20 μm. The TAB tape 17 is bent from the outside of the CCD connected portion (at step e). Thus, the outer connecting leads can be easily extracted from the rear surface of the CCD.

However, the above-described related art references have the following drawbacks.

In the COG method, when the wiring layer is extracted from an edge of the optical glass 1, the screen printing is required. However, printing defects tend to take place at the edge portion, thereby lowering the yield of the fabrication. In addition, after the CCD package was mounted, a step for connecting an outer connecting flexible substrate is required. Thus, the fabrication process is complicated. On the other hand, in the SP-TAB method, it is difficult to precisely adhere the optical glass 11 and the adhesive agent 19. As shown in FIG. 25, the optical glass 11 should be placed on the upper portion of the TAB leads 17 disposed on both edges of the CCD. Such a construction is technically difficult to accomplish. In addition, the TAB leads should be connected to the corresponding pins of the electrode portions of the CCD according to the heat pressing method. Thus, this method takes a long time and thereby ineffective. As a drawback in common with the COG method and the SP-TAB method, a cavity takes place in the CCD image area. In other words, after the package was mounted, it is filled and sealed with a resin. However, the gap between the CCD and the optical glass other than the connecting portions of the electrode pads is relatively large (from 20 to 50 μm). Thus, when the package is filled and sealed with the resin, the resin enters the CCD image area. Thus, the effect of focusing macro lenses is optically lost, thereby deteriorating the characteristics of the CCD.

SUMMARY OF THE INVENTION

The present invention is made from the above-described points of view.

A first object of the present invention is to provide a photoelectric converting device mounting apparatus for allowing the fabrication process thereof to be simplified and a fabrication method thereof.

A second object of the present invention is to provide a photoelectric converting device mounting apparatus for preventing leads of a substrate from being bent and a fabrication method thereof.

A third object of the present invention is to provide a photoelectric converting device mounting apparatus for allowing a space to be securely formed in the apparatus and a fabrication method thereof.

A fourth object of the present invention is to provide a photoelectric converting device mounting apparatus for allowing the adhering strength between a substrate and an optical glass to be improved and a fabrication method thereof.

A fifth object of the present invention is to provide a photoelectric converting device mounting apparatus for allowing devices to be mounted thereon with a very high density and a fabrication method thereof.

A sixth object of the present invention is to provide a photoelectric converting device for allowing the yield of the fabrication thereof to be improved and a fabrication method thereof.

A seventh object of the present invention is to provide a photoelectric converting device mounting apparatus with a small size and a fabrication method thereof.

An eighth object of the present invention is to provide a photoelectric converting device mounting apparatus for preventing an incident light beam of a photoelectric converting device from being reflected and a fabrication method thereof.

A ninth object of the present invention is to provide a photoelectric converting device mounting apparatus for easily purging gas and dust that take place in a step for adhering a substrate and a photoelectric converting device and a fabrication method thereof.

To accomplish such objects, a first aspect of the present invention is a photoelectric converting device mounting apparatus, comprising a light transmitting member for transmitting a light beam, a wiring board having a first surface and a second surface, a plurality of leads being formed on the first surface, the second surface being adhered to the light transmitting member, a photoelectric converting device having a plurality of electrode pads corresponding to the leads and being adapted to receive a light beam transmitted by the light transmitting member, and an anisotropically conductive film formed at least between the leads and the corresponding electrode pads. A dummy lead may be formed on the wiring board.

A second aspect of the present invention is a photoelectric converting device mounting method, comprising the steps of adhering a second surface of a wiring board onto a light transmitting member, a plurality of leads being formed on a first surface of the wiring board, and forming an anisotropically conductive film between the leads and corresponding electrode pads of the photoelectric converting device.

According to the present invention, since the anisotropy conductor film is formed between the leads and the corresponding electrode pads, the fabrication process can be simplified. Since the leads are formed on the wiring board, the leads can be prevented from being bent. In addition, the wiring board has the dummy lead, a space can be securely formed in the apparatus.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 24 is a schematic diagram showing steps of conventional SP-TAB method; and.

DESCRIPTION OF PREFERRED EMBODIMENTS

Next, with reference to the accompanying drawings, embodiments according to the present invention will be described.

Figure 1:
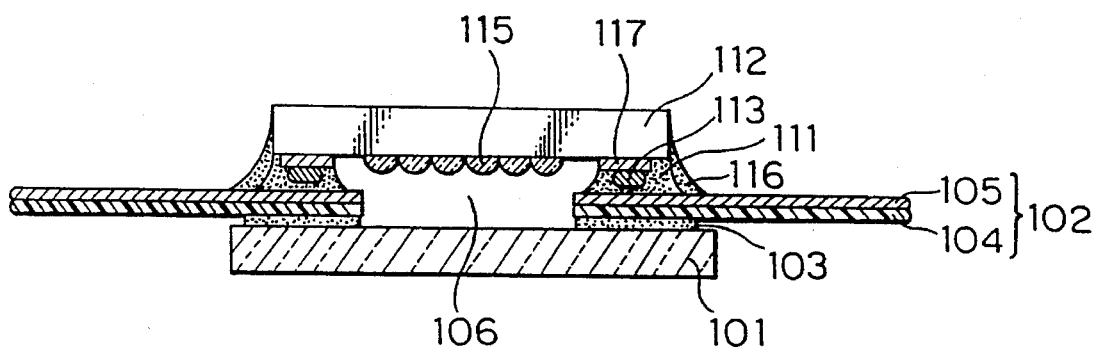
FIG. 1 is a sectional view showing a CCD mounting apparatus according to a first embodiment of the present invention.

FIG. 1 is a sectional view showing a construction of a CCD mounting apparatus according to a first embodiment of the present invention.

As shown in FIG. 1, a TAB tape 102 is adhered to one surface of an optical glass 101 by an adhesive agent 103.

The optical glass 101 transmits a light beam. The thickness of the optical glass is for example 2 mm. The optical glass may be an optical low-pass filter that transmits a light beam.

Figure 2:
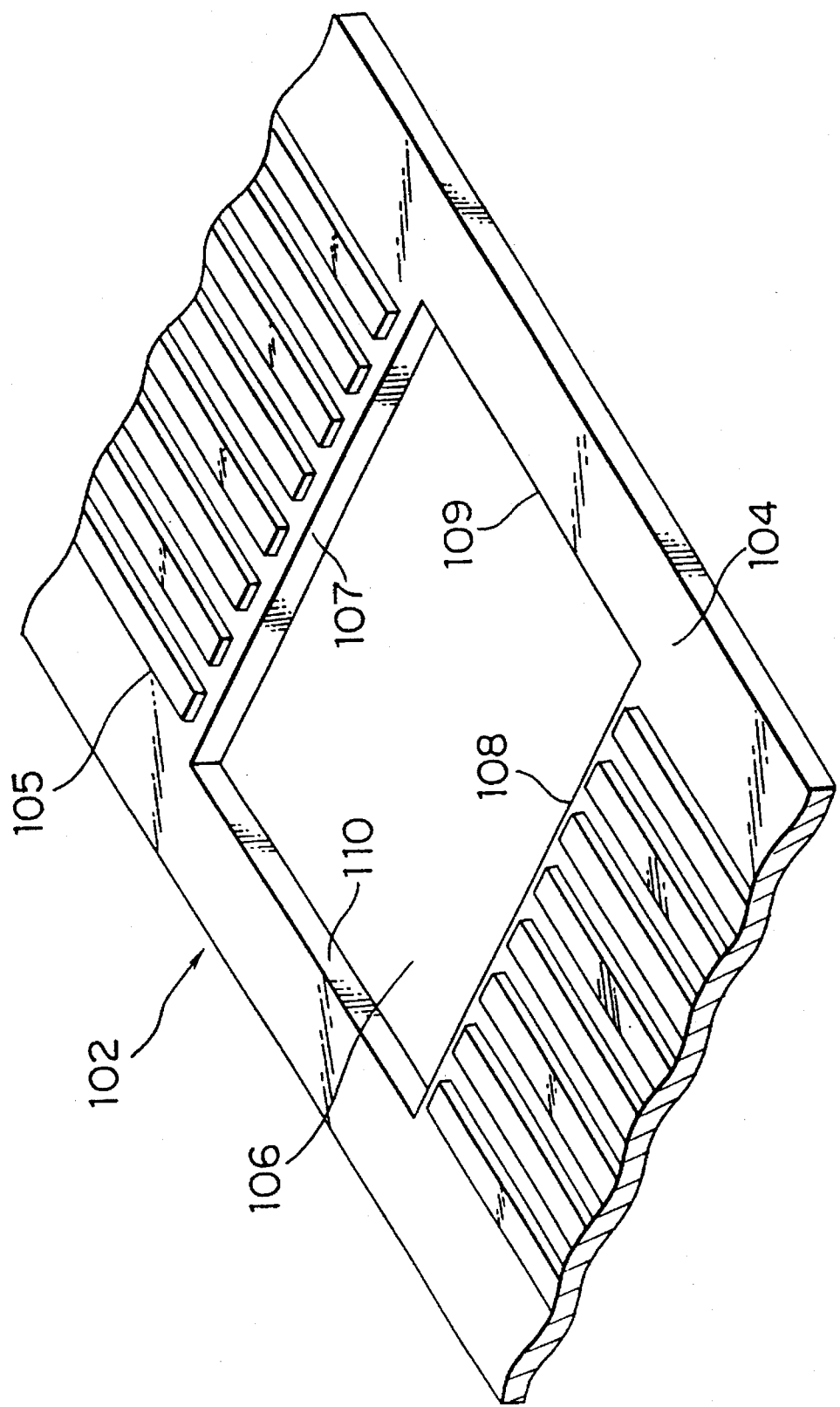
FIG. 2 is a perspective view showing a TAB tape of FIG. 1.

As shown in FIG. 2, the TAB tape 102 comprises an insulation sheet 104 and a plurality of copper leads 105. The copper leads 105 are formed on the insulation sheet 104. The TAB sheet 102 can be freely bent. The insulation sheet 104 is made of for example polyimide or glass epoxy resin. The thickness T104 of the insulation sheet 104 is for example 100 mm. The insulation sheet 104 has an opening portion 106. The shape of the opening portion 106 is for example rectangular. The opening portion 106 transmits an incident light beam emitted from the optical glass 101 to a rear surface of a CCD 112. The copper leads 105 are formed on two opposed sides 107 and 108 of the insulation sheet 104 at predetermined pitches. In other words, the insulation sheet 104 is disposed between adjacent copper leads 105. The insulation sheet 104 is disposed on the rear surface of the copper leads 105. It should be appreciated that the copper leads 105 may be formed on other sides 109 and 110 of the opening portion 106. The thickness T105 of the copper leads 105 is for example 35 mm. The width W105 of the copper leads 105 is for example 100 mm. It should be appreciated that a non-flexible substrate may be used instead of the TAB tape 102. The color of such a substrate is preferably black so as to prevent an incident light beam from being reflected. In this case, the substrate may be made of a black material or coated with a black paint.

The adhesive agent 103 is made of for example an epoxy resin. The adhesive agent 103 is for example heat hardening type or ultraviolet hardening type. The thickness of the adhesive agent 103 is for example in the range from 10 to 20 mm.

Figure 3:
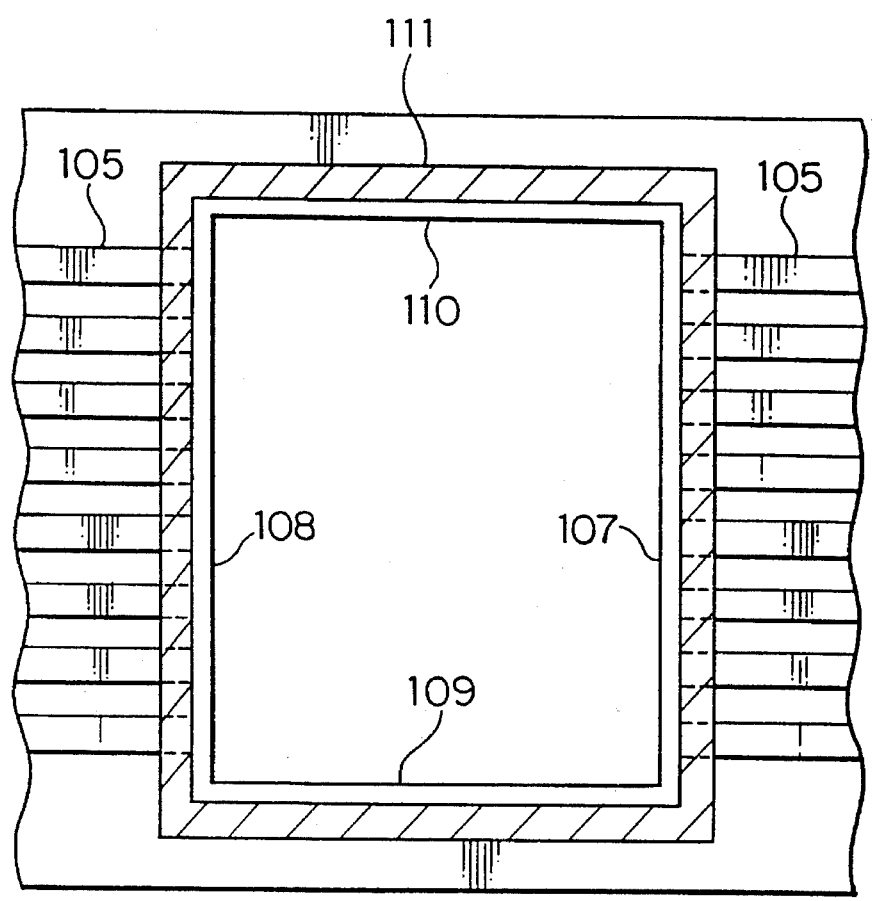
FIG. 3 is a plan view showing the TAB tape of FIG. 1.

The CCD 112 is connected to the TAB tape 102 through an anisotropically conductive film 111. As shown in FIG. 3, the anisotropically conductive film 111 is preferably formed on the sides 109 and 110 of the opening portion 106 as well as the sides 107 and 108. The anisotropically conductive film 111 conducts electricity between electrodes. In addition, the anisotropically conductive film 111 mechanically connects the TAB tape 102 and the CCD 112. Moreover, the anisotropically conductive film 111 seals a cavity formed by the opening portion 106 and the like. The color of the anisotropically conductive film 111 is preferably black so as to prevent an incident light beam from being reflected.

Figure 4:
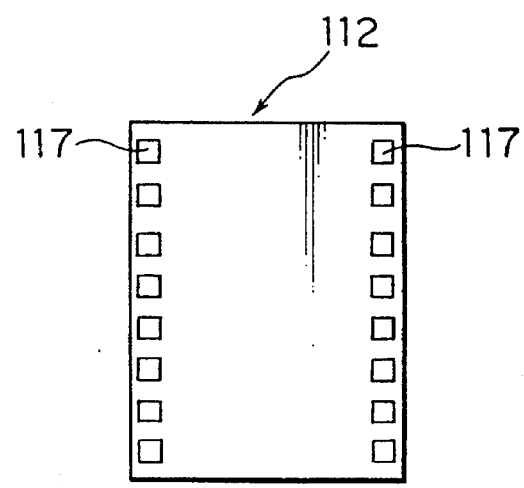
FIG. 4 is a plan view showing the CCD of FIG. 1.

The CCD 112 has for example 140,000 pixels. The size of the CCD 112 is for example 4 mm×4 mm. The thickness of the CCD 112 is for example 0.6 mm. As shown in FIG. 4, electrode pads 117 are formed along two sides of the CCD 112 corresponding to the copper leads 105. It should be appreciated that the electrode pads 117 may be formed along the four sides of the CCD 112. The size of each of the electrode pads 117 is for example 100 mm×100 mm. Bumps 113 are formed on the corresponding electrode pads 117. The height of the bump 113 is for example 30 mm. The copper leads 105 and the corresponding bumps 113 are electrically connected through conductive particles contained in the anisotropically conductive film 111. Micro lenses 115 are formed on a light receiving surface of the CCD 112. The CCD 112 receives a light beam through the optical glass 101, the opening portion 106, and the micro lenses 115.

A sealing resin 116 is formed on the optical glass 101 so that the sealing resin 116 fully covers the anisotropically conductive film 111. The sealing resin 116 is for example an epoxy type sealing resin. For example, the sealing resin 116 is a heat hardening type or an ultraviolet hardening type. The sealing resin 116 protects the electric connections and mechanical connections between the TAB tape 102 and the CCD 112. In a real CCD mounting apparatus, the sealing resin 116 may be omitted. This is because the anisotropically conductive film 111 functions as the sealing resin 116. When the sealing resin 116 is omitted, the fabrication process can be simplified.

Figure 5:
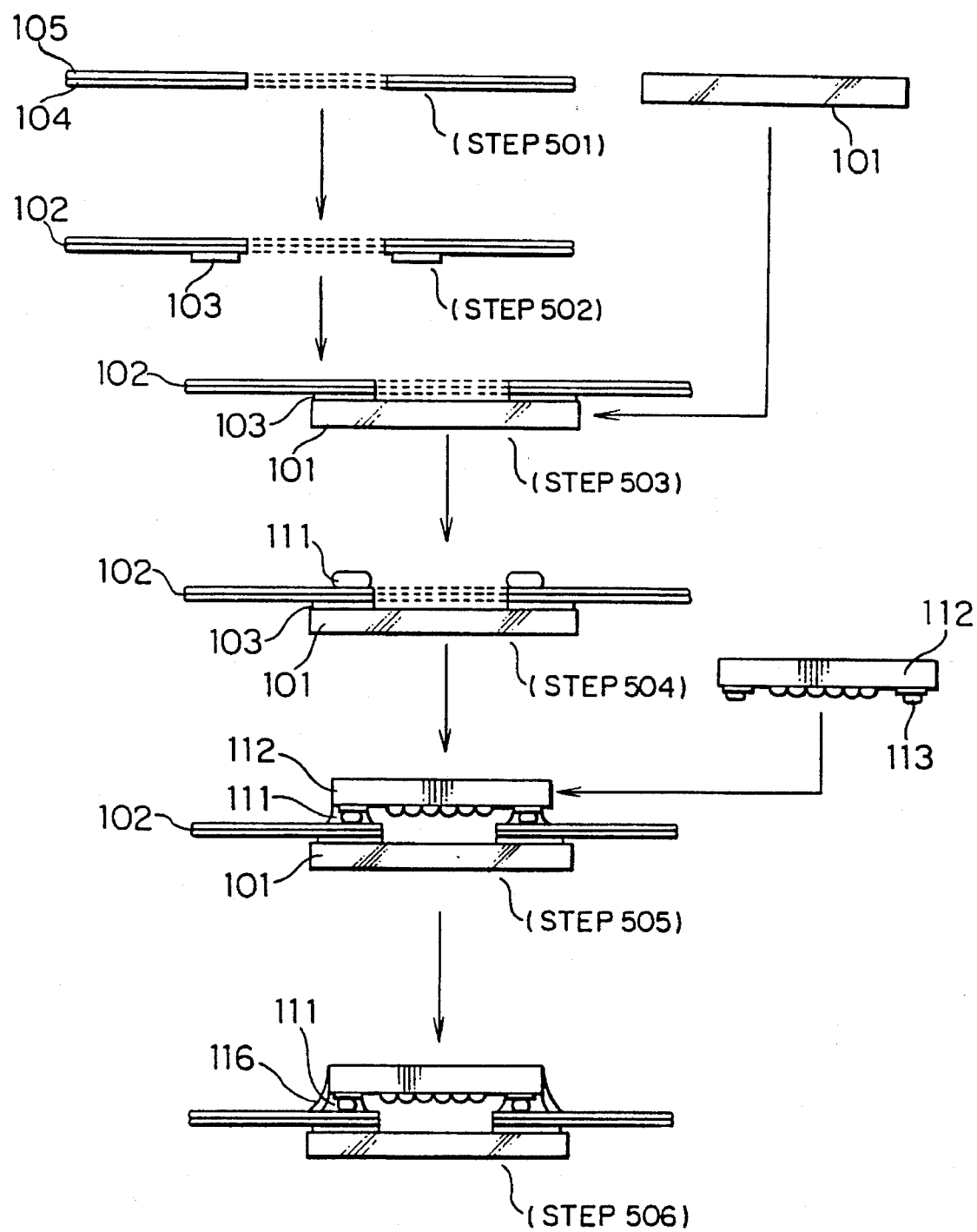
FIG. 5 is a schematic diagram showing steps of a fabrication method of the CCD mounting apparatus according to a second embodiment of the present invention.

FIG. 5 is a schematic diagram showing steps of a fabrication method of the CCD mounting apparatus of FIG. 1 according to a second embodiment of the present invention.

Copper leads 105 are formed on an insulation sheet 104 by an etching method or the like (at step 501).

An adhesive agent 103 is layered on the opposite surface of a TAB tape 102 (namely, on a non-component side) by a screen printing method or the like (at step 502).

Figure 6:
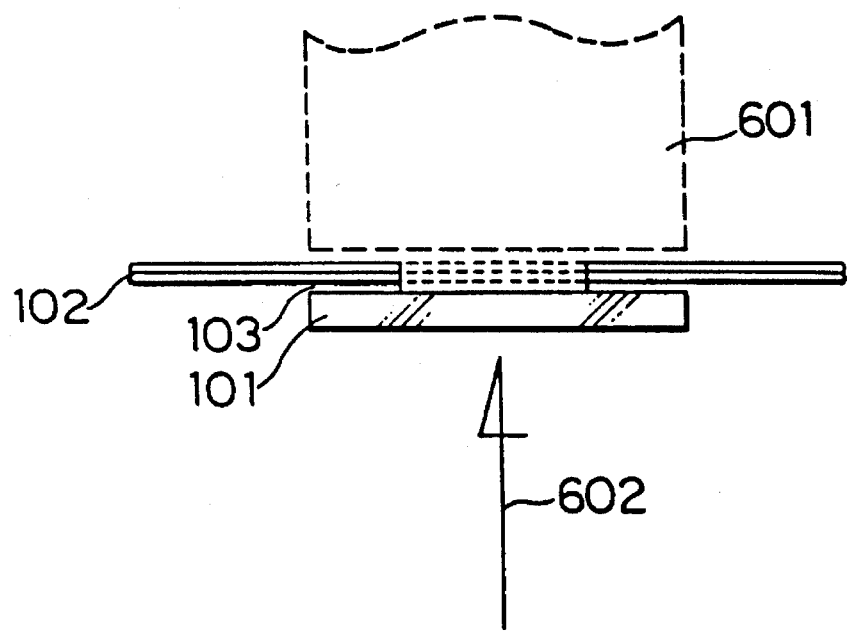
FIG. 6 is a sectional view for explaining an adhering step of the TAB tape and an optical glass.

An optical glass 101 and the TAB tape 102 are adhered by the adhesive agent 103 (at step 503). At the step 503, as shown in FIG. 6, upper portions of the copper leads 105 are heat pressed by a heater tool 601. An ultraviolet ray 602 is irradiated from the rear surface of the optical glass 101. Thus, the optical glass 101 and the TAB tape 102 are adhered in a short time (for example, from several seconds to several ten seconds). In other words, the adhering step can be remarkably shortened in comparison with the conventional method where the copper leads 105 are adhered, one by one.

An anisotropically conductive film 111 is formed on the TAB tape 102 by a screen printing method or the like (at step 504). The anisotropically conductive film 111 is a paste type material. The anisotropically conductive film 111 is formed on the TAB tape 102 by a dispenser method or a screen printing method. It should be appreciated that the anisotropically conductive film 111 may be a frame shaped, film type material.

The distance between a pixel area of the CCD 112 and a chip edge of the CCD 112 is in the range from around 0.3 to 0.5 mm. Since the adhering width for the anisotropically conductive film 111 is narrow, the frame shaped anisotropically conductive film is difficult to be formed. Instead, an anisotropy conductive paste is suitable. When the anisotropy conductive paste is coated by a dispenser, the viscosity of the anisotropy paste should be in the range from 10,000 to 20,000 cps. In the case that the diameter of the nozzle portion of the dispenser is around 0.2 mm; the coating pressure is in the range from 1.5 to 3.0 kg; and the coating speed is in the range from 1 to 3 mm/sec, the coating amount is optimized (namely, the width of the anisotropy conductive paste is 0.2 mm and the height thereof is in the range from 60 to 90 μm). In the screen printing method, when a stainless screen with for example 2.50 meshes is used and the printing speed is in the range from 50 to 120 mm/sec, such an optimum coating amount is obtained.

The TAB tape 102 and the CCD 112 are connected through the anisotropically conductive film 111 so that the copper leads 105 are aligned with the corresponding bumps 113 (at step 505). The anisotropically conductive film 111 is heated or pressured so as to connect the TAB tape 102 and the CCD 112. The anisotropically conductive film 111 is composed by dispersing 3 to 30% of gold particles with diameters ranging from 1 to 10 μm in for example epoxy resin. The anisotropically conductive film 111 is fully covered by the sealing resin 116. Thereafter, the sealing resin 116 is heated or an ultraviolet ray is irradiated thereto (at step 506).

After the TAB tape 102 and the CCD 112 were connected by the anisotropically conductive film 111, the optical glass 101 and the TAB tape 102 may be adhered by the adhesive agent 103.

Figure 7:
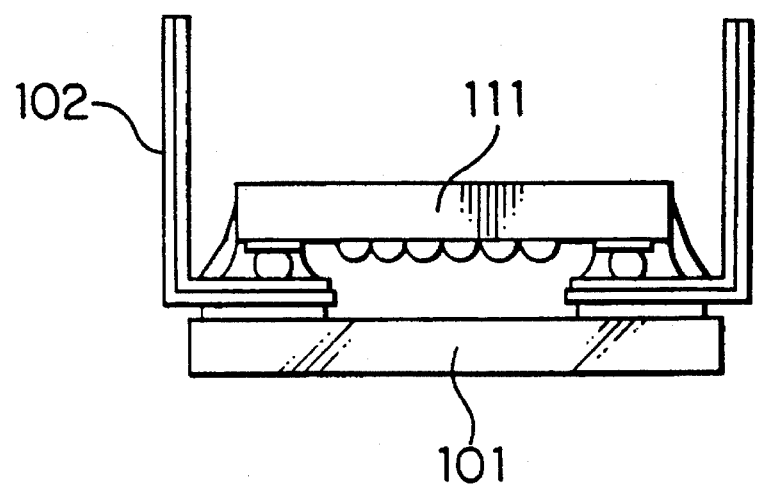
FIG. 7 is a sectional view showing a step after the fabrication method of FIG. 5.

When the TAB tape 102 of the real CCD mounting apparatus shown in FIG. 1 and at the step 506 of FIG. 5 is bent as shown in FIG. 7, the diagonal length of the CCD mounting apparatus of a 4-mm square CCD 112 with leads of the TAB tape 102 is approximately 7 mm, thereby accomplishing a very small camera having a camera case with a diameter of 8 mm.

In the CCD mounting apparatus according to the second embodiment, since the many copper leads 105 formed on the insulation sheet 104 are adhered to the optical glass 101 at a time, the adhering step can be simplified.

Figure 8A:
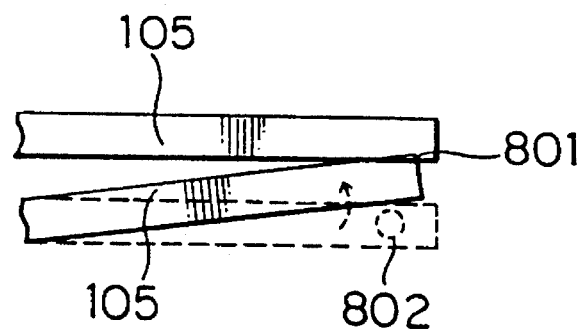
FIG. 8A is a sectional view for explaining an effect of the present invention.
Figure 8B:
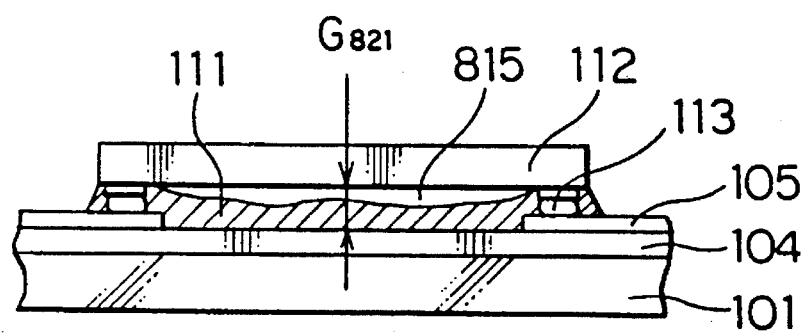
FIG. 8B is a sectional view for explaining another effect of the present invention.
Figure 8C:
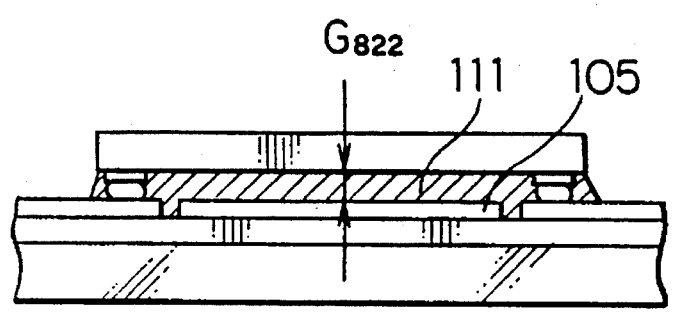
FIG. 8C is a sectional view for explaining a further effect of the present invention.

When the many copper leads 105 are adhered to the optical glass 101 at a time, as shown in FIG. 8A, the copper leads 105 tend to be bent. Thus, a contact defect 801 may take place between adjacent copper leads 105. In addition, the copper leads 105 and the corresponding bumps 113 are dislocated. Thus, imperfect connections may take place. According to the present invention, the TAB tape 102, where the insulation sheet 104 is disposed between the adjacent copper leads 105 and the insulation sheet 104 is always disposed on the rear surface of the copper leads 105, is adhered to the optical glass 101, as shown in FIG. 8A, the copper leads 105 can be prevented from being bent. In this construction, since the insulation sheet 104 is always disposed between the adjacent copper leads 105, when the TAB tape 102 and the CCD 112 are connected with the anisotropically conductive film 111, the anisotropically conductive film 111 tends to adhere to the insulation sheet 104 and the copper leads 105. Thus, the anisotropically conductive film 111 can be prevented from entering the opening portion 106 and the like of the TAB tape 102. In this construction, the insulation sheet 104 is disposed between the bumps 113 and the optical glass 101. In addition, the copper leads are partially disposed between the bumps 113 and the optical glass 101. Thus, the distance between the bumps 113 and the optical glass 101 becomes as narrow as 20 to 30 μm. Consequently, the anisotropically conductive film 111 can be prevented from entering the opening portion 106 and the like of the TAB tape 102. As a result, the space of the cavity can be securely obtained. Thus, the anisotropically conductive film 111 can be prevented from entering the image area of the CCD 112. Consequently, the optical characteristics of the micro lenses 115 formed on the front surface of the CCD 112 can be prevented from deteriorating, thereby preventing the characteristics of the CCD from deteriorating. As shown in FIG. 8B, when the insulation sheet 104 is formed, the distance G821 between the CCD 112 and the insulation sheet 104 including the thickness of the bumps 113 and the thickness of the copper leads 105 is approximately 65 μm. When the coating thickness of the anisotropically conductive film 111 is less than the distance G821, a partial opening portion 815 tends to take place where the CCD 112 is not filled with the anisotropically conductive film 111. To prevent such a problem, as shown in FIG. 8C, dummy copper leads 105 are formed. Thus, the distance G822 between the CCD 112 and the dummy copper leads 105 becomes as small as 30 μm, which is equal to the height of the bumps. Thus, in this construction, since the coating amount of the Anisotropically Conductive Film (hereinafter referred to ACF) is reduced, the ACF can be prevented from entering the opening portion 106. In addition, the space between the ACF and the CCD can be easily sealed.

In the CCD mounting apparatus according to the second embodiment, since the optical lens 101 is adhered to the CCD with the TAB tape 102, the adhering surface can be widened, thereby improving the adhering strength.

Next, a third embodiment of the present invention will be described.

Figure 9:
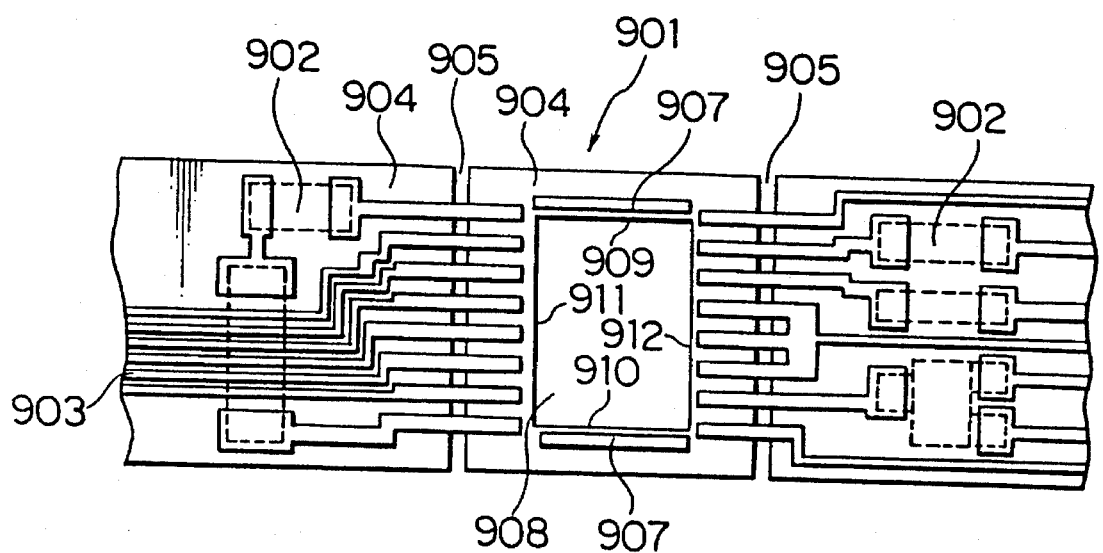
FIG. 9 is a plan view showing a CCD mounting apparatus according to a third embodiment of the present invention.
Figure 10:
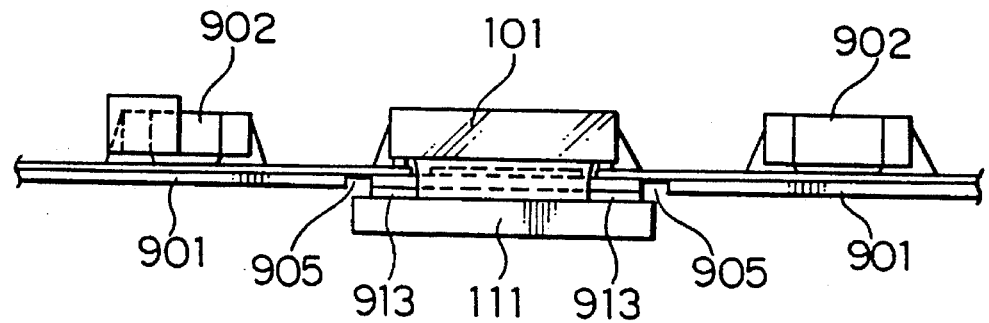
FIG. 10 is a sectional view showing the CCD mounting apparatus according to the third embodiment of the present invention.

FIG. 9 is a plan view showing a CCD mounting apparatus according to the third embodiment of the present invention. FIG. 10 is a sectional view of FIG. 10.

The CCD mounting apparatus according to the third embodiment differs from the CCD mounting apparatus according to the first embodiment (shown in FIG. 1) in the following four points.

(1) In the CCD mounting apparatus according to the third embodiment, electronic devices 902 are mounted on a TAB tape 901. Examples of the electronic devices 902 are capacitors, resistors, and transistors. It should be appreciated that the electronic devices 902 may be mounted on both the front and rear surfaces of the TAB tape 901. Copper leads 903 extend from the TAB tape 901. The copper leads 903 are connected to for example inspection pads or a main substrate. Since the electronic devices 902 are mounted on the TAB tape 901, the CCD mounting apparatus can mount devices with a very high density. Thus, much smaller cameras can be accomplished. In this construction, it is preferable to mount the electronic devices 902 on the TAB tape 901 and inspect them before connecting the TAB tape 901 and the CCD 112. If the CCD 112 is mounted before mounting the electronic devices 902, since the heat resisting characteristic of the CCD 112 is low, the CCD 112 is thermally damaged during a soldering step. Thus, the yield of the fabrication of the CCD mounting apparatus can be improved.

Figure 11:
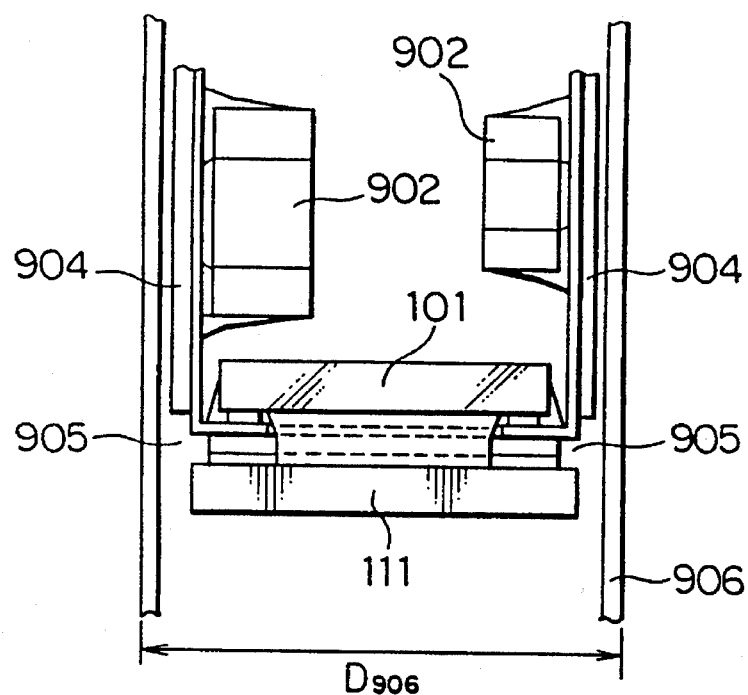
FIG. 11 is a sectional view for explaining an effect of the third embodiment of the present invention.

(2) In the CCD mounting apparatus according to the third embodiment, blank portions 905 that are blanked from the insulation sheet 904 are formed at bending portions of the TAB tape 901. As shown in FIG. 11, the blank portions 905 are formed so that the TAB tape 901 is sharply bent and accommodated in a camera casing 906. Thus, the diameter D906 of the camera casing 906 can be decreased.

Figure 12:
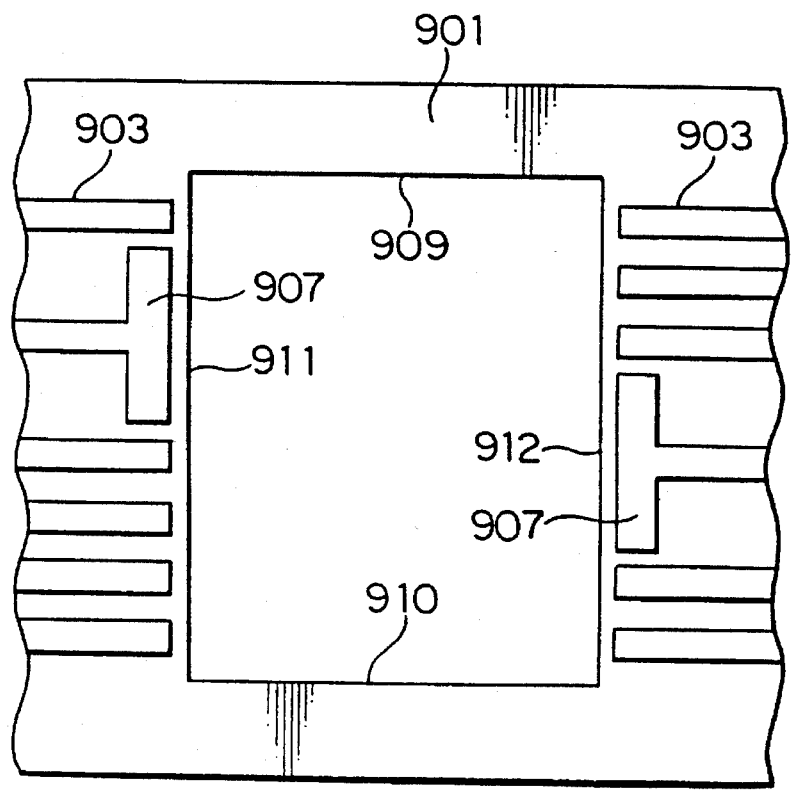
FIG. 12 is a plan view showing a TAB tape according to the third embodiment of the present invention.

(3) In the CCD mounting apparatus according to the third embodiment, the TAB tape 901 has dummy leads 907. The dummy leads 907 are formed on the insulation sheet 904 on two sides 909 and 910 where the copper leads 903 are not formed. The dummy leads 970 extends along the sides 909 and 910. As shown in FIG. 3, when an anisotropically conductive film 111 is formed on four sides, it can be prevented from entering the opening portion 908 and so forth of the TAB tape 901 from the sides 909 and 910. As shown in FIG. 12, the dummy leads 907 may be formed along the sides 911 and 912, where the copper leads 903 are formed. In this construction, the anisotropically conductive film 111 can be prevented from entering the opening portion 908 and the like of the TAB tape 901. The dummy leads 907 may be formed on the optical glass 101. In addition, the dummy leads 907 may be formed on both the TAB tape 901 and the optical glass 101.

Figure 16:
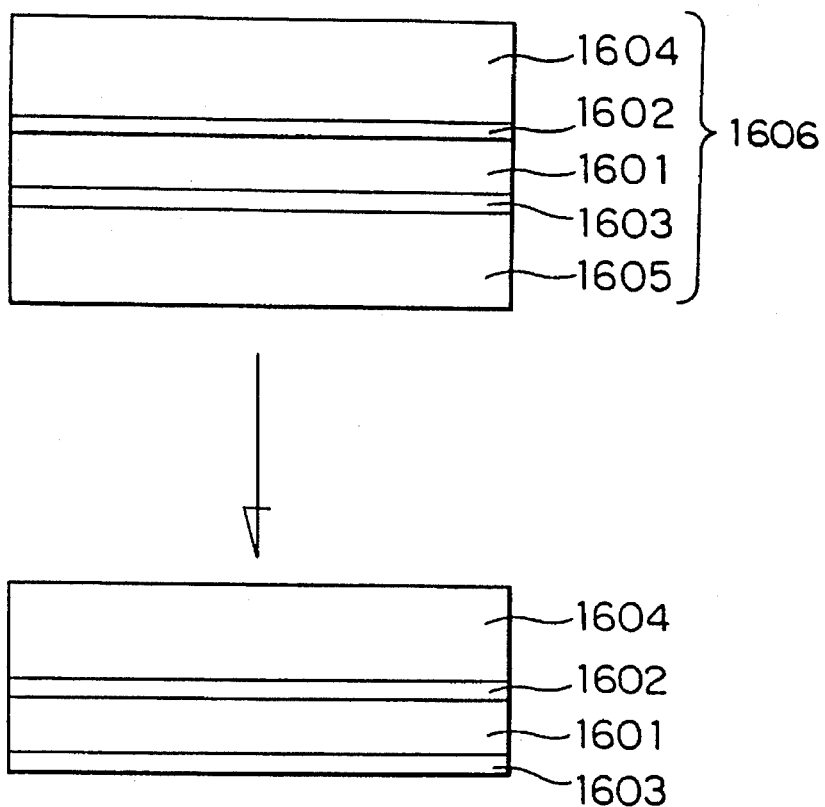
FIG. 16 is a schematic diagram showing steps of a rough surfacing process according to the third embodiment of the present invention.

(4) In the CCD mounting apparatus according to the third embodiment, an adhering surface of the TAB tape 901 and the optical glass 101 is roughly formed. In this construction, the adhering strength between the TAB tape 901 and the optical glass 101 is improved. FIG. 16 is a schematic diagram showing steps of the rough surfacing process. As shown in the drawing, copper clads 1604 and 1605 are formed on the front and rear surfaces of a substrate 1601 through respective adhesive agent layers 1602 and 1603. The copper clad 1605 on one surface of the substrate 1601 is etched out. The adhesive agent layer 1603 remains on the surface where the copper clad 1605 was etched out. The adhesive agent layer 1603 functions as a rough surface. The rough surface prevents an incident light beam of the CCD 112 from being reflected.

Figure 13:
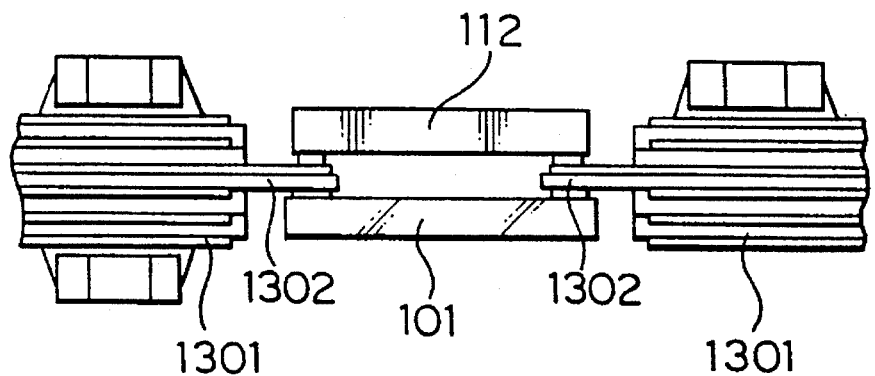
FIG. 13 is a sectional view showing a CCD mounting apparatus according to a fourth embodiment of the present invention.

FIG. 13 is a perspective view showing a CCD mounting apparatus according to a fourth embodiment of the present invention. In the CCD mounting apparatus according to the fourth embodiment, a TAB tape 1302 that protrudes from a multi-layer substrate 1301 is connected to a CCD 112. When the multi-layer substrate 1301 is used, the CCD mounting apparatus can be formed with a very high density.

Figure 14:
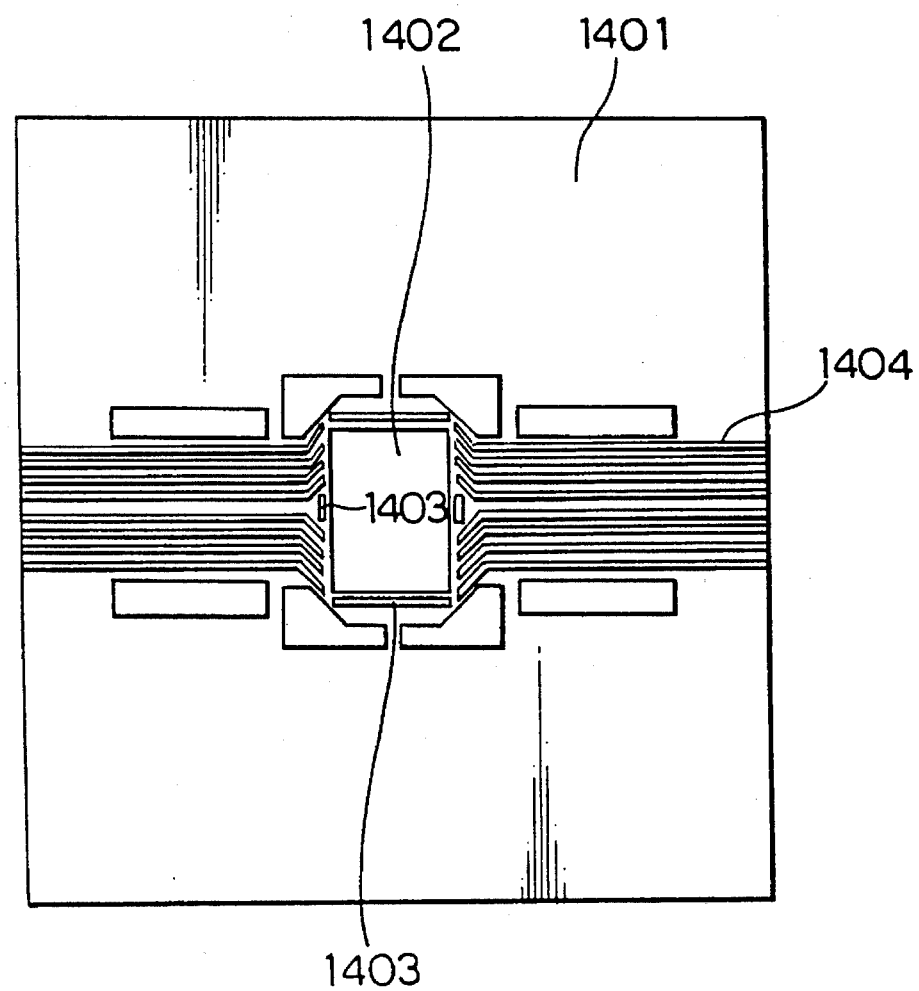
FIG. 14 is a plan view showing a TAB tape according to a fifth embodiment of the present invention.

FIG. 14 is a plan view showing a CCD mounting apparatus according to a fifth embodiment of the present invention. In the CCD mounting apparatus according to the fifth embodiment, an opening portion 1402 is formed for example nearly at the center of a TAB tape 1401. A CCD (not shown) is formed at the opening portion 1402. In FIG. 14, reference numeral 1403 is a dummy lead. Reference numeral 1404 is a copper lead.

Figure 15A:
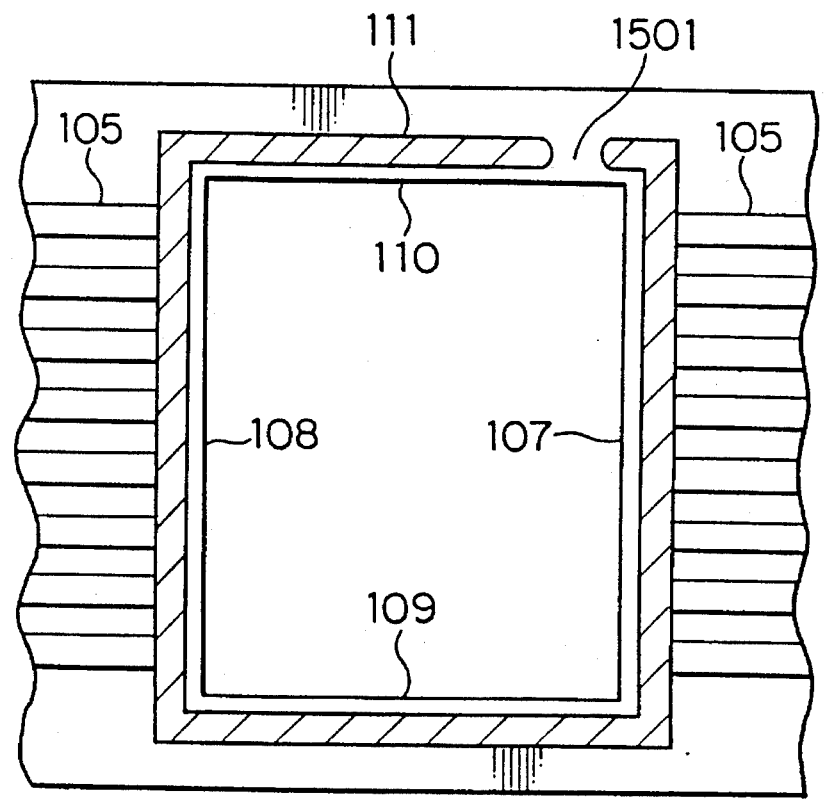
FIG. 15A is a plan view showing a TAB tape according to a sixth embodiment of the present invention.
Figure 15B:
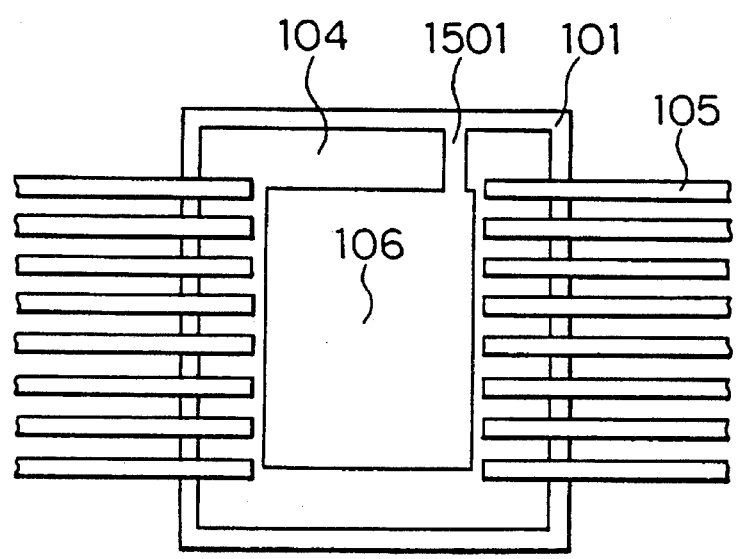
FIG. 15B is another plan view showing the TAB tape according to a sixth embodiment of the present invention.

FIGS. 15A and 15B are plan views showing a CCD mounting apparatus according to a sixth embodiment of the present invention.

As shown in FIG. 3, in the CCD mounting apparatus according to the sixth embodiment, an anisotropically conductive film blank portion 1501 is formed at least part of sides 107, 108, 109, and 110. The anisotropically conductive film blank portion 1501 is a blank portion where an anisotropically conductive film 111 is blanked. The anisotropically conductive film blank portion 1501 serves to purge a gas that takes place in the adhering process where the anisotropically conductive film 111 is heat pressed to a TAB tape 102, serves to purge a gas so as to prevent expanded air in the cavity portion 106 from mechanically stressing the connecting portions, serves to substitute air in the cavity portion 106 with nitrogen gas after mounting the CCD 112, and serves to purge foreign matter such as dust present in the cavity portion 106 by vacuum sucking or air blow. After the TAB tape 102 and the CCD 112 are adhered, the anisotropically conductive film blank portion 1501 is sealed by for example a sealing resin. As shown in FIG. 15B, a gas purging portion 1501 may be formed by blanking a part of an insulation sheet 104.

Next, a seventh embodiment of the present invention will be described.

Figure 17:
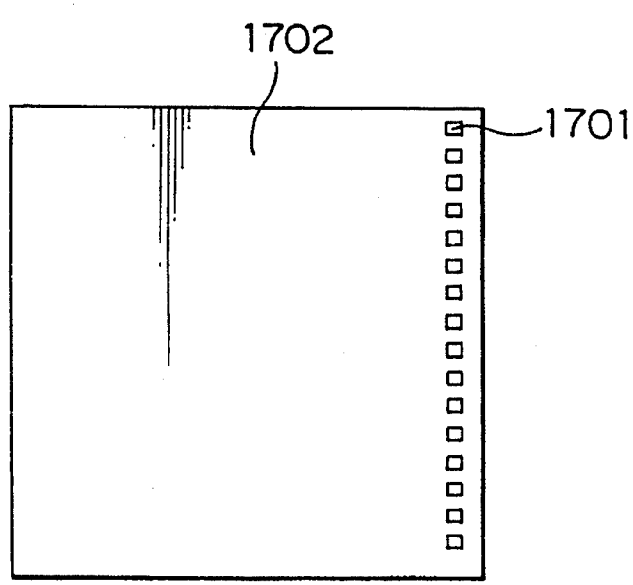
FIG. 17 is a plan view showing a CCD according to a seventh embodiment of the present invention.

In the seventh embodiment, as shown in FIG. 17, electrode pads 1701 are formed along only one side of a CCD 1702. In this construction, the copper leads 105 extend in one direction. Thus, peripheral devices can be easily mounted and camera cables can be easily connected, thereby simplifying the assembling process.

Figure 18:
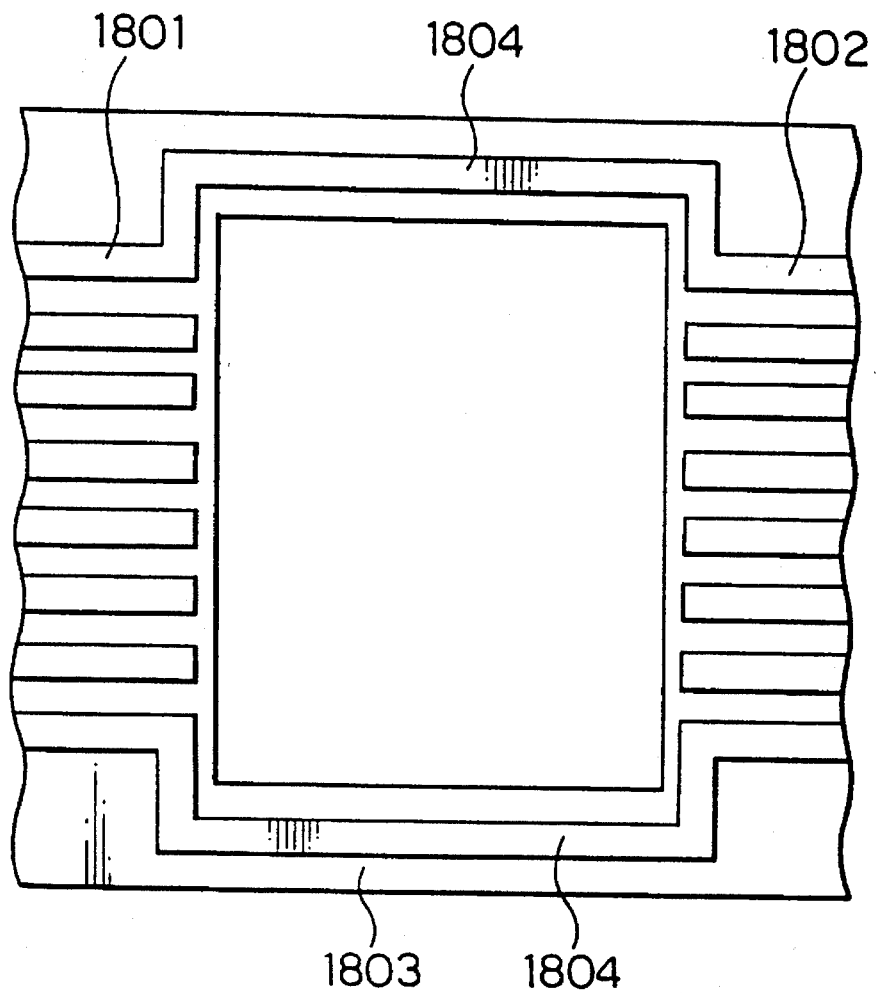
FIG. 18 is a plan view showing a TAB tape according to a modification of the seventh embodiment of the present invention.
Figure 19:
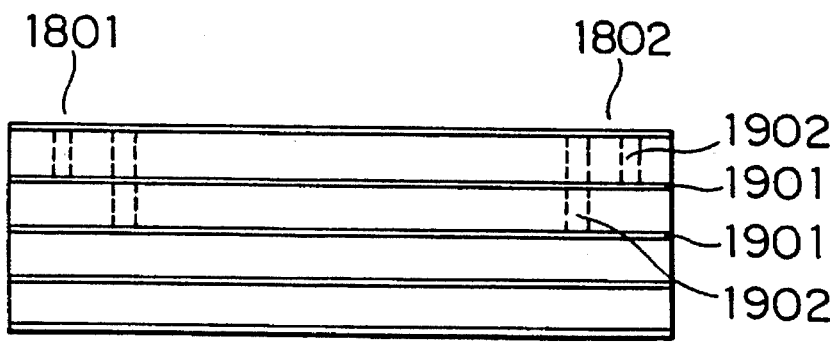
FIG. 19 is a sectional view showing a TAB tape according to another modification of the seventh embodiment of the present invention.

As shown in FIG. 18, an electrode pad of a copper lead 1801 and an electrode pad of a copper lead 1802 may be connected through a copper lead 1804 so as to improve the efficiency of the line connections. In this embodiment, the wiring pattern is formed of one layer. As shown in FIG. 19, a TAB tape 1803 may be formed of a plurality of layers. Each layer may have a line 1901. The line 1901, the copper lead 1801, and the copper lead 1802 may be connected by a through-hole. A copper lead 1804 may function as a dummy lead.

Figure 20:
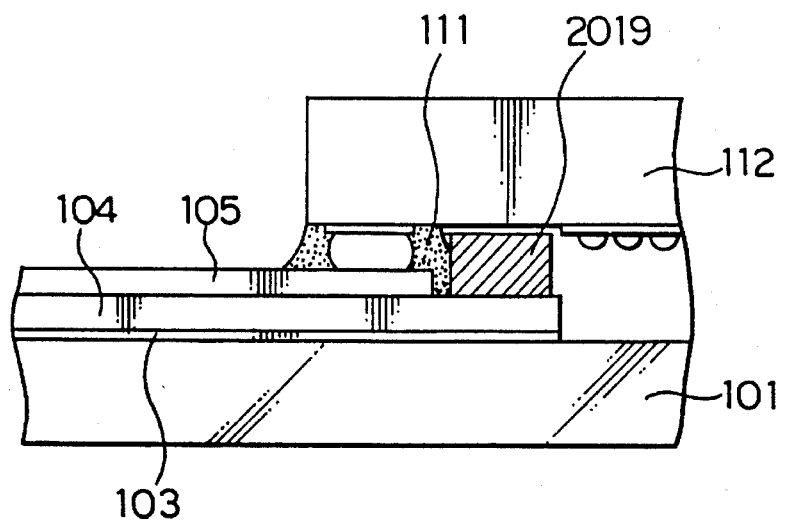
FIG. 20 is a sectional view showing a CCD mounting apparatus according to an eighth embodiment of the present invention.

FIG. 20 is a sectional view showing a CCD mounting apparatus according to an eighth embodiment of the present invention. When a CCD 112 and copper leads 105 are connected by an anisotropically conductive film 111, a dam frame 2019 is formed on an insulation sheet 104 at the forward edge of copper leads 105. The dam frame 2019 may be formed by coating an insulation paste made of such as epoxy resin on for example copper leads 105 according to a screen printing method. In addition, the dam frame 2019 may be formed according to photoetching method. Moreover, the dam frame 2019 may be formed on the periphery of the pixel area of the CCD 112. At time point, the height of the dam frame 2019 may be controlled so that it does not interfere with the bump connections. If an elastic material such as a silicone compound is used for the dam frame 2019, when the bumps are connected to electrodes, stress thereof can be reduced. The dam frame 2019 is preferably made of a material that is insoluble against the anisotropically conductive film 111.

Figure 21:
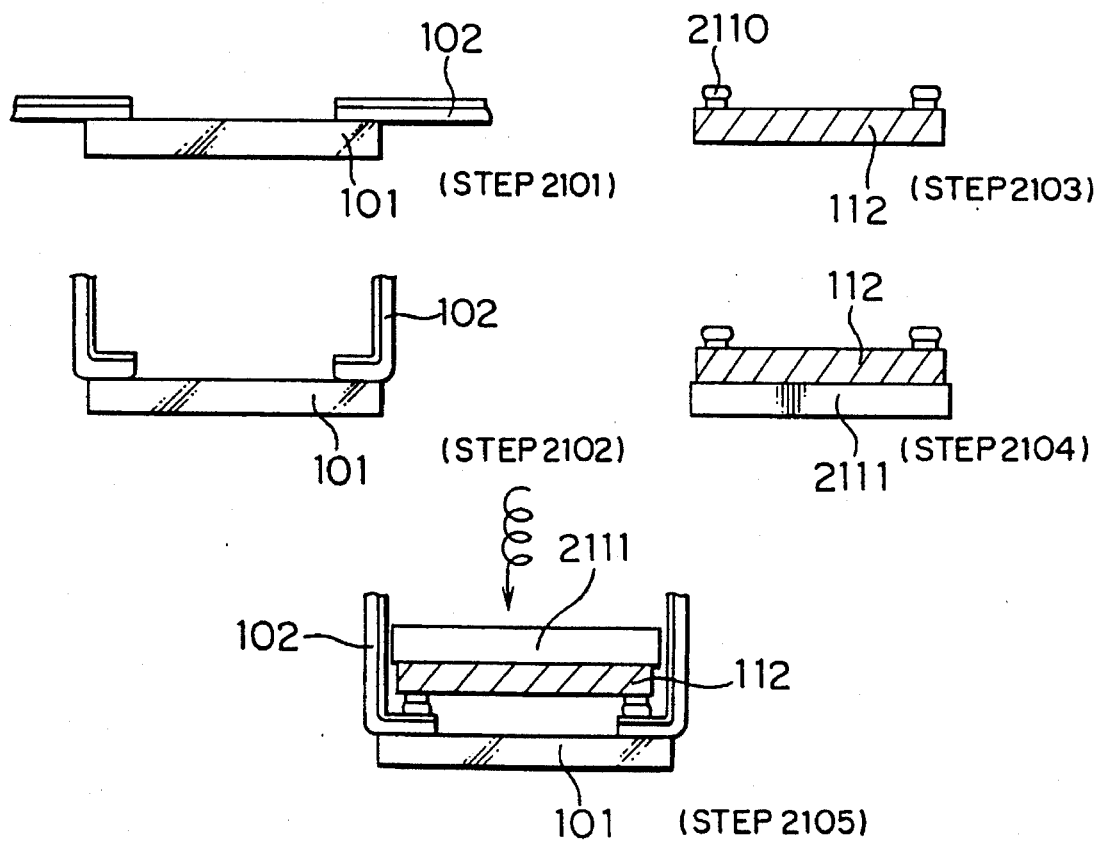
FIG. 21 is a schematic diagram showing steps of a fabrication method of a CCD mounting apparatus according to a ninth embodiment of the present invention.

FIG. 21 is a schematic diagram showing steps of a fabrication method according to a ninth embodiment of the present invention.

An optical glass 101 and a TAB tape 102 are adhered (at step 2101). The TAB tape 102 is bent at both edges (at step 2102). Gold ball bumps 2110 are formed at electrode pads of a CCD 112 (at step 2103). An alignment backing glass sheet 2111 is placed on the CCD 112 (at step 2104).

The resultant assembly is inserted into a camera casing (not shown). When an optical glass 101 disposed at a lower position of the TAB tape 102 and the alignment backing glass sheet 2111 disposed on the CCD 112 are accurately pressured, bumps 113 and the TAB tape 102 can be electrically connected (at step 2105).

Figure 22:
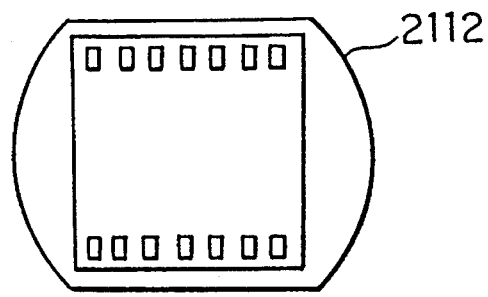
FIG. 22 is a plan view showing the CCD mounting apparatus according to the ninth embodiment of the present invention.
Figure 23:
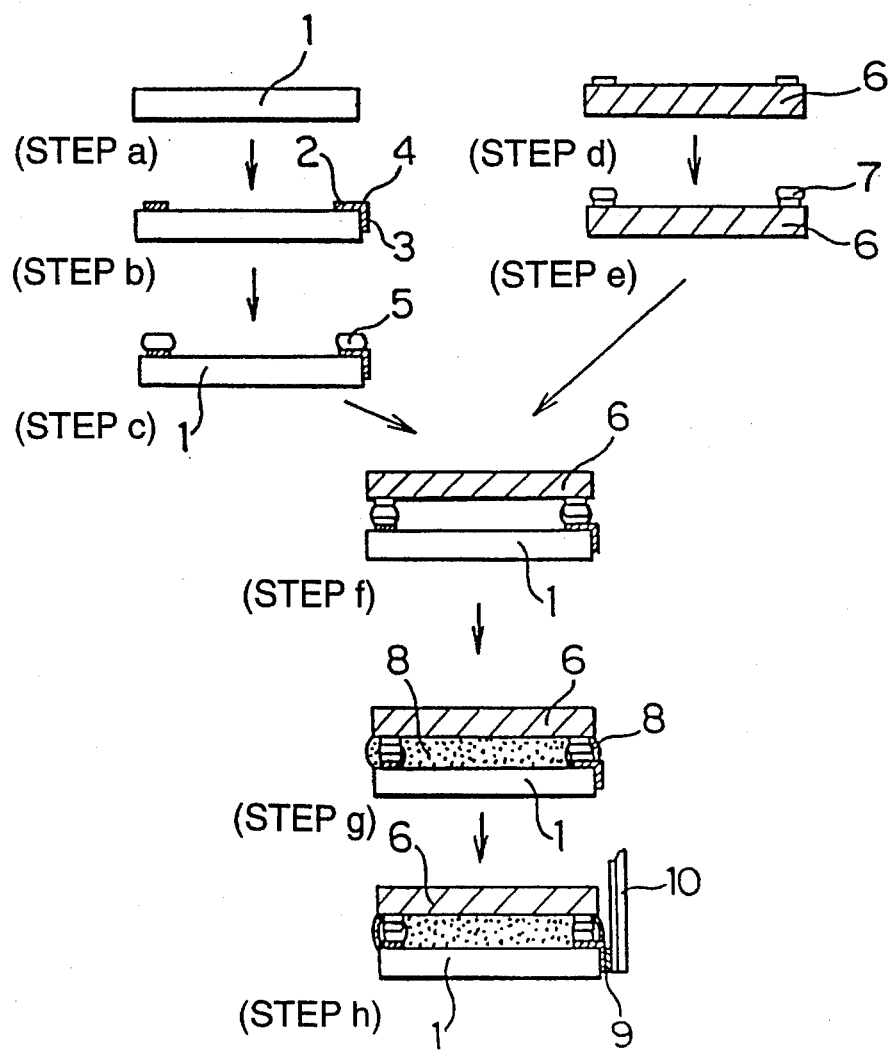
FIG. 23 is a schematic diagram showing steps of conventional SP-TAB method.
Figure 24:
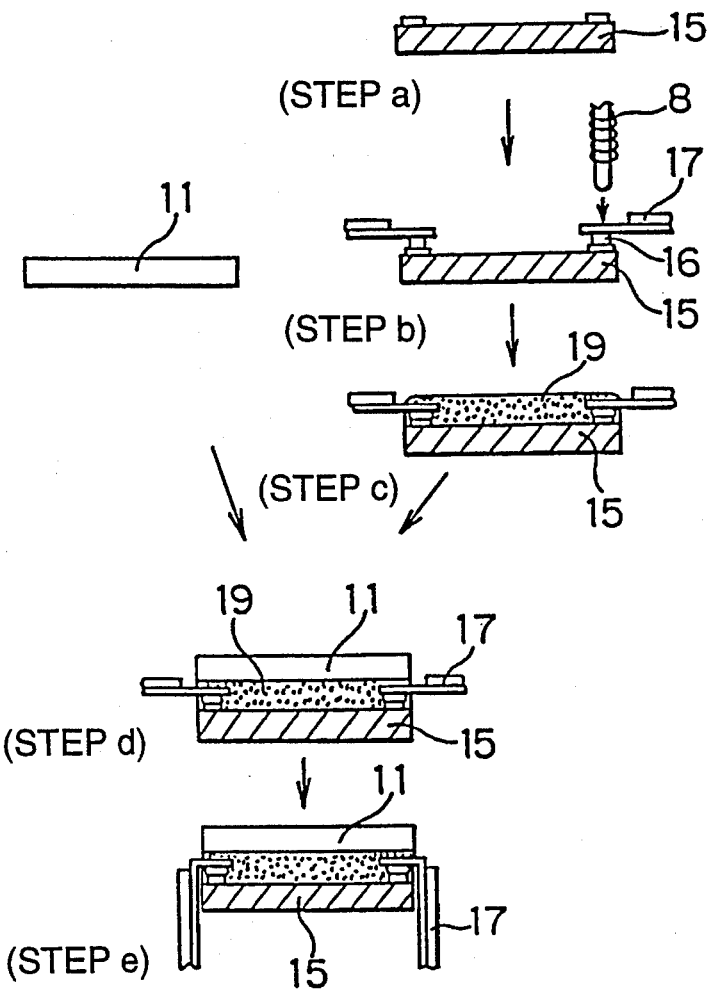
Figure 25:
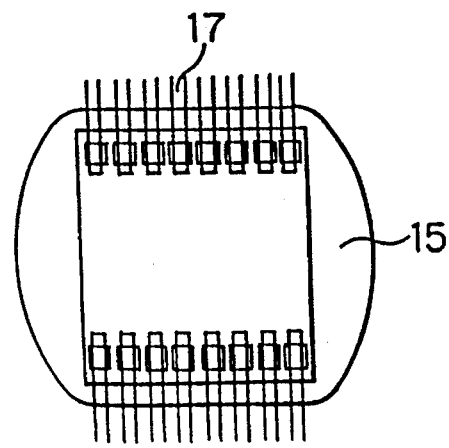
FIG. 25 is a plan view showing a portion where an optical glass and an adhesive agent are layered in the conventional SP-TAB method.

The alignment backing glass sheet 2111 disposed on the rear surface of the CCD 112 is pressured through a silicon rubber member or the like with a force of 1 kgf (50 gf/bump). FIG. 22 is a plan view showing the alignment backing glass sheet 2111. Arc portions that are formed on other than TAB lead portions of the alignment backing glass sheet 2111 are used for alignment reference positions. In this embodiment, when the CCD that is mounted in the apparatus gets defective, it can be replaced with a good one without damaging the TAB tape and so forth.

In the above-described embodiments, a CCD is used as a photoelectric converting device. However, it should be appreciated that for example a sensor may be used instead of the CCD.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A photoelectric converting device mounting apparatus, comprising:

a light transmitting member for transmitting a light beam;

a wiring board having a first surface and a second surface, a plurality of leads being formed on the first surface, the second surface being adhered to said light transmitting member;

a photoelectric converting device having a plurality of electrode pads corresponding to the leads and being adapted to receive a light beam transmitted by said light transmitting member; and an anisotropically conductive film formed at least between the leads and the corresponding electrode pads.

2. The apparatus as set forth in claim 1, wherein said wiring board is flexibly bendable.

3. The apparatus as set force in claim 1, wherein said wiring board has an opening portion that transmits the light beam transmitted by said light transmitting member, the leads being formed along the opening portion, said anisotropically conductive film being formed along the opening portion.

4. The apparatus as set forth in claim 1, wherein at least one of said wiring board and said anisotropically conductive film is black.

5. The apparatus as set forth in claim 3, wherein dummy leads are formed along the opening portion of said wiring board.

6. The apparatus as set forth in claim 1, wherein an electronic device is formed at least one of surfaces of said wiring board.

7. The apparatus as set forth in claim 1, wherein said wiring board is a multi-layer board, a plurality of leads being formed on a first surface of at least one substrate of the multi-layer board, a second surface of the substrate being adhered to said light transmitting member.

8. The apparatus as set forth in claim 2, wherein said wiring board has a bend portion, a base material constructing said wiring board being blanked from at least part of the bend portion on which the leads are formed.

9. The apparatus as set forth in claim 3, wherein at least part of said wiring board along the opening portion is a multi-layer board, the dummy leads being electrically connected through a line of the multi-layer board.

10. The apparatus as set forth in claim 3, wherein at least one of said wiring board and said anisotropically conductive film has a blank portion where a base material constructing said wiring board or said anisotropically conductive film is blanked.

11. The apparatus as set forth in claim 5, wherein said dummy lead is made of other than a material of the leads.

12. The apparatus as set forth in claim 1, wherein said light transmitting member functions as an optical low-pass filter.

13. The apparatus as set forth in claim 1, wherein the second surface of said wiring board is roughly formed.

14. The apparatus as set forth in claim 1, wherein said photoelectric converting device is formed in a rectangular shape, the electric pads being formed along one side of said photoelectric converting device.

* * * * *